(12) United States Patent
Cho

(10) Patent No.: US 8,319,321 B2
(45) Date of Patent: Nov. 27, 2012

(54) LEADLESS PACKAGE FOR HIGH CURRENT DEVICES

(75) Inventor: Eung San Cho, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/193,449

(22) Filed: Jul. 28, 2011

(65) Prior Publication Data

US 2011/0278711 A1    Nov. 17, 2011

Related U.S. Application Data

(62) Division of application No. 12/583,991, filed on Aug. 28, 2009, now Pat. No. 7,994,615.

(51) Int. Cl.
*H01L 23/495* (2006.01)
*H01L 23/34* (2006.01)

(52) U.S. Cl. ........ 257/676; 257/666; 257/784; 257/723; 257/E23.037

(58) Field of Classification Search .................. 257/676, 257/666, 784, 686, E23.037
See application file for complete search history.

(56) References Cited

U.S. PATENT DOCUMENTS

| | | | | |
|---|---|---|---|---|
| 7,154,186 B2* | 12/2006 | Noquil et al. | | 257/778 |
| 7,735,532 B2* | 6/2010 | Tanno et al. | | 152/157 |
| 7,776,658 B2* | 8/2010 | Liu et al. | | 438/121 |
| 8,049,314 B2* | 11/2011 | Do et al. | | 257/676 |
| 2005/0206010 A1* | 9/2005 | Noquil et al. | | 257/778 |
| 2010/0133670 A1* | 6/2010 | Liu et al. | | 257/675 |
| 2012/0032244 A1* | 2/2012 | Hebert et al. | | 257/299 |

* cited by examiner

*Primary Examiner* — Nitin Parekh

(74) *Attorney, Agent, or Firm* — Farjami & Farjami LLP

(57) ABSTRACT

Some exemplary embodiments of a direct contact leadless package and related structure and method, especially suitable for packaging high current semiconductor devices, have been disclosed. One exemplary structure comprises a first contact lead frame portion, a paddle portion, and an extended contact lead frame portion held together by a mold compound. A first semiconductor device is attached to a top side of the paddle portion and is enclosed by said mold compound, while a second semiconductor device is attached to a bottom side of said paddle portion and is in electrical contact with said the first semiconductor device. The extended contact lead frame portion is in direct electrical contact with the second semiconductor device without using a bond wire. Alternative exemplary embodiments may include additional extended lead frame portions, paddle portions, and semiconductor devices in various configurations.

12 Claims, 4 Drawing Sheets

LEADLESS PACKAGE FOR HIGH CURRENT DEVICES

This is a divisional of application Ser. No. 12/583,991 filed Aug. 28, 2009 now U.S. Pat. No. 7,994,615.

BACKGROUND OF THE INVENTION

1. Field of the Invention

The present invention relates generally to semiconductor device packages. More particularly, the present invention relates to leadless semiconductor packages.

2. Background Art

Packages are required in the integrated circuit (IC) industry to provide housing for semiconductor devices and circuits, to provide mechanical strength, stability, and reliability, and to prevent damage to semiconductor devices and circuits. Packages are also required to have small form factors, good heat dissipation capability, electrical leads or other electrical connections that do not significantly add to inductance and resistance in signal paths. These packaging requirements should be achieved at a reasonable cost, since semiconductor packages might end up costing much more than the semiconductor devices and circuits that are housed within.

The packaging of power transistors and devices requires meeting additional and unique challenges, including not only a reduced form factor, but also a high current carrying capability, as well as a high reliability standard. Moreover, packages for power transistors and devices should be relatively simple to produce since only a few transistors or devices are housed in each package and, therefore, a greater portion of the cost of the final product is the package itself.

Previous solutions have relied on, for example, complex wire bond technology for various terminals of power transistors or power devices that have resulted in reduced reliability and increased packaging complexity, while not accommodating high current carrying capability and low form factor requirements of power transistors and devices. Moreover, closely packed power transistors housed along with their control integrated circuits (control ICs) have exacerbated the problems associated with efficient packaging of power transistors and devices next to control ICs interfacing and controlling the power transistors and devices. Thus, a unique solution resulting in high current carrying capability, efficient and dense packaging, and low form factor is needed.

SUMMARY OF THE INVENTION

A direct contact leadless package for high current devices, substantially as shown in and/or described in connection with at least one of the figures, as set forth more completely in the claims.

DETAILED DESCRIPTION OF THE INVENTION

The present application is directed to a direct contact leadless package for high current devices. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1A:
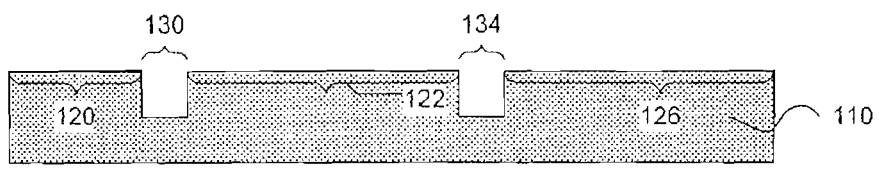
FIG. 1A illustrates a cross sectional view of a package in fabrication according to an embodiment of the invention, corresponding to an initial step of packaging.

FIG. 1A illustrates a cross sectional view of a package in fabrication according to an embodiment of the invention, corresponding to an initial step of half-etching a lead frame. More specifically, FIG. 1A shows a cross sectional view of a package in the process of fabrication. Indentations 130 and 134 are formed in lead frame 110, dividing a top side of lead frame 110 into surfaces 120, 122, and 126. For example, a half-etching process with an appropriate template might be used to form indentations 130 and 134.

Figure 1B:
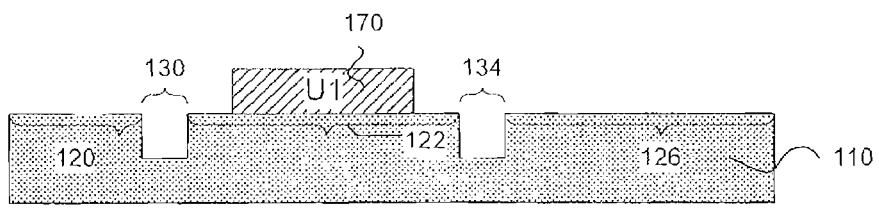
FIG. 1B illustrates a cross sectional view of a package in fabrication according to an embodiment of the invention, corresponding to an intermediate step of packaging.

Utilizing the lead frame fabricated in the previous step shown in FIG. 1A, during the next step illustrated in FIG. 1B, semiconductor device 170, labeled U1, is attached to the top of lead frame 110 on surface 122, Semiconductor device 170 may comprise, for example, a control integrated circuit (IC) or driver IC to control one or more power transistors or devices. However, semiconductor device 170 is not limited to a control IC or driver IC and may comprise other semiconductor devices that can be used to perform various functions, and for example in conjunction with a power transistor or power device.

Figure 1C:
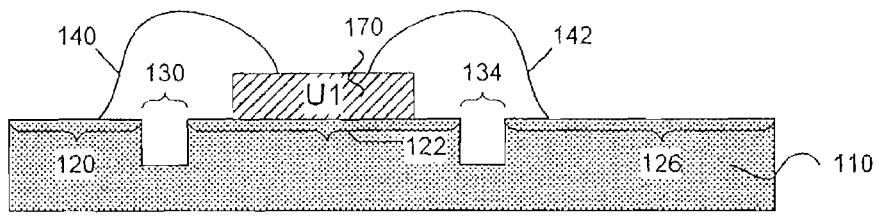
FIG. 1C illustrates a cross sectional view of a package in fabrication according to an embodiment of the invention, corresponding to an intermediate step of packaging.

FIG. 1C shows a cross sectional view of a package in the process of fabrication continuing from FIG. 1B. Bond wire 140 is attached between a bonding pad situated on top of semiconductor device 170 and a pad on surface 120, whereas bond wire 142 is attached between a bonding pad on top of semiconductor device 170 and a pad on surface 126 (bonding pads are not shown in the drawings). These wire bonds may provide electrical connections that semiconductor device 170 can use, for example, to control other semiconductor devices. As FIG. 1C is shown as a cross sectional view, additional bond wires (not shown) might also be connected parallel to bond wires 140 and 142 to provide additional electrical connections for semiconductor device 170. Separate bond wires omitted from FIG. 1C might optionally be connected between the top of semiconductor device 170 and surface 122 to provide, for example, current sensing capability for semiconductor device 170 or for providing additional ground connections for semiconductor 170. Furthermore, alternative methods of providing electrical connections may also be used instead of bond wires.

Figure 1D:
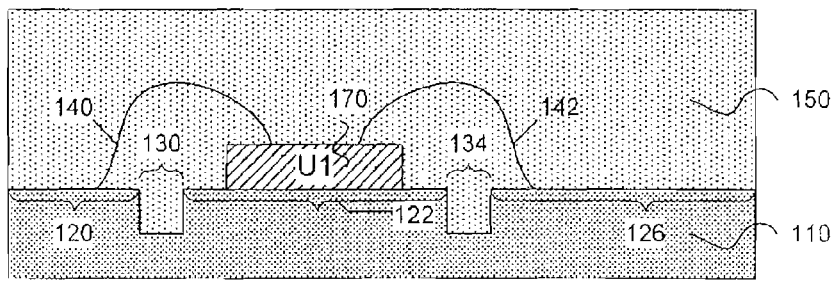
FIG. 1D illustrates a cross sectional view of a package in fabrication according to an embodiment of the invention, corresponding to an intermediate step of packaging.

Next, FIG. 1D shows a cross sectional view of a package in the process of fabrication continuing from FIG. 1C. Mold compound 150 is formed around the package, enclosing semiconductor device 170, bond wires 140 and 142, and the top side of lead frame 110. In this manner, the elements of the package can be held together as one modular unit, facilitating simplified integration.

Figure 1E:
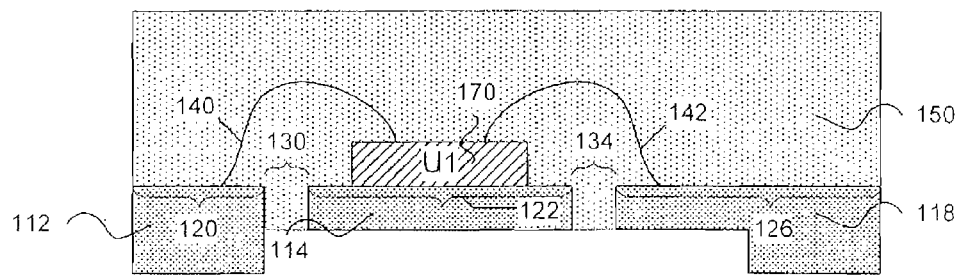
FIG. 1E illustrates a cross sectional view of a package in fabrication according to an embodiment of the invention, corresponding to an intermediate step of packaging.

FIG. 1E shows a cross sectional view of the package in the process of fabrication continuing from FIG. 1D. Contact lead frame portion 112, paddle portion 114, and extended contact lead frame portion 118 are formed from lead frame 110. For example, an etching process might be used similar to the process used to form indentations 130 and 134 in FIG. 1A, except that the etching process starts from the bottom side of lead frame 110 rather than the top side of lead frame 110, and a different template appropriate for the bottom side is used. Thus, existing fabrication processes can be advantageously used in a cost effective manner. Although some portions of lead frame 110 are etched away completely such as the areas corresponding to indentations 130 and 134, the presence of mold compound 150 keeps the package held together, avoiding the need for a mold tape or a supporting substrate.

As shown in FIG. 1E, contact lead frame portion 112 retains the same height as lead frame 110, whereas paddle portion 114 has a reduced thickness relative to lead frame 110 and is effectively raised in position compared to contact lead frame portion 112. Extended contact lead frame portion 118 has a portion with the same thickness of contact lead frame portion 112 and a remainder portion with the same reduced thickness and raised position as paddle portion 114. As shown by the cross sectional view of FIG. 1E, extended contact lead frame portion 118 may thus have the appearance of an L-shaped overhang.

Figure 1F:
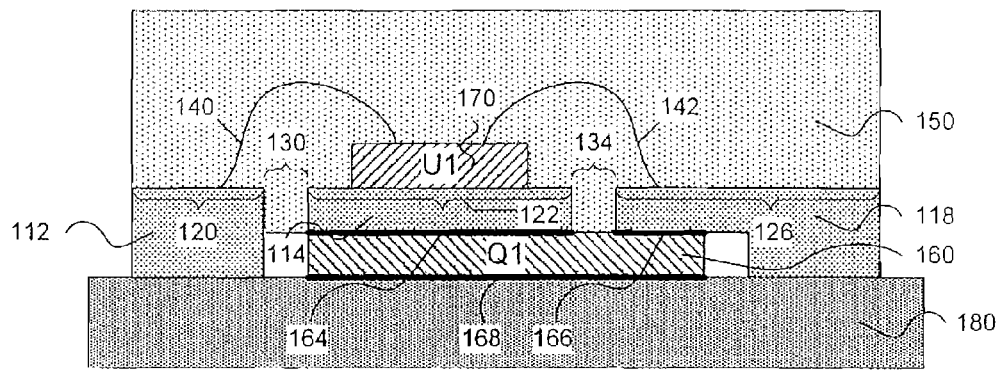
FIG. 1F illustrates a cross sectional view of a package in fabrication according to an embodiment of the invention, corresponding to a final step of packaging.

FIG. 1F shows a cross sectional view of a package in the process of fabrication continuing from FIG. 1E. Semiconductor device 160, labeled Q1, is attached to the bottom of paddle portion 114 by conductive die attach, pad, land, solder bumps or balls, or other electrical contact interface 164. Semiconductor device 160 is also in direct electrical contact with extended contact lead frame portion 118 by conductive die attach, pad, land, solder bumps or balls, or other electrical contact interface 166. After attaching semiconductor device 160, the fabrication of the package is essentially complete and the package may then be attached on top of printed circuit board (PCB) 180 for integration using conductive die attach, pad, land, solder bumps or balls, or other electrical contact interface 168 on the bottom surface of semiconductor device 160. It should be noted that PCB 180 may extend beyond the cross section shown in FIG. 1F and may also include other components not shown in FIG. 1F.

Semiconductor device 160 might be, for example, a power transistor, comprising a silicon, silicon germanium, gallium arsenide, gallium nitride, or other III-nitride field effect transistor (FET) or high electron mobility transistor (HEMT), or any other type of power transistor or device. In this case, electrical contact interface 166 may provide electrical contact to a gate terminal of the power transistor, electrical contact interface 164 may provide electrical contact to a source terminal of the power transistor, and electrical contact interface 168 may provide electrical contact to a drain terminal of the power transistor. These are only given as exemplary terminal assignments, and alternative embodiments may arrange terminals as demanded for particular applications. For example, electrical contact interface 164 may connect to a drain terminal and electrical contact interface 168 may connect to a source terminal.

Assuming the terminal assignments provided above, semiconductor device 170, for example a control IC, may then control the operation of semiconductor device 160, for example a power transistor. As shown in FIG. 1F, semiconductor device 170 is in electrical contact with electrical contact interface 164 via paddle portion 114, and semiconductor device 170 is also in electrical contact with electrical contact interface 166 via bond wire 142 and extended contact lead frame portion 118. Thus, for example, a control IC 170 may apply a voltage between electrical contact interface 166 connected to a gate of a power transistor and electrical contact interface 164 connected to a source of the power transistor to control the current flow between the source and the drain of the power transistor, the drain being connected to electrical contact interface 168.

Since electrical contact interfaces 164, 166, and 168 are respectively in direct contact with paddle portion 114, extended contact lead frame portion 118, and PCB 180, an advantageous and efficient direct contact system with a large contact surface area is provided having increased reliability, reduced resistance and inductance, and greater current conduction capability. For example, in one embodiment, land grid arrays (LGAs), solder bumps, solder balls, and/or studs might be used for electrical contact interface 166, whereas LGAs, solder bumps, and/or solder balls might be used for electrical contact interface 164, and LGAs might be used for electrical contact interface 168. These electrical connection schemes are only provided as examples, and one may use any combination of direct contacts as needed in various applications.

The large surface area direct contacts provided by electrical contact interfaces 164, 166, and 168 allow semiconductor device 160 to handle high current density and also dissipate heat in an efficient manner by avoiding the longer routes and limited contact areas provided by traditional interconnect methods such as wire bonds. Since the complex routing required for wire bonds can be avoided, a reduced package form factor and footprint may also be achieved. The mechanical simplicity of the present invention's package further enhances stability and reliability, and avoids problems such as high stress areas leading to cracked substrates.

Furthermore, the double-sided contacts of semiconductor device 160 provide flexible cooling options for efficient heat dissipation. For example, thermal vias might be used within PCB 180 to route heat from semiconductor device 160 to an external metal chassis, and a top mounted heat sink with forced air cooling might still be mounted above mold compound 150, allowing concurrent dispersion of heat from both top and bottom sides. If thickness of the package is a greater design consideration, then the top mounted heat sink may be omitted.

Figure 2A:
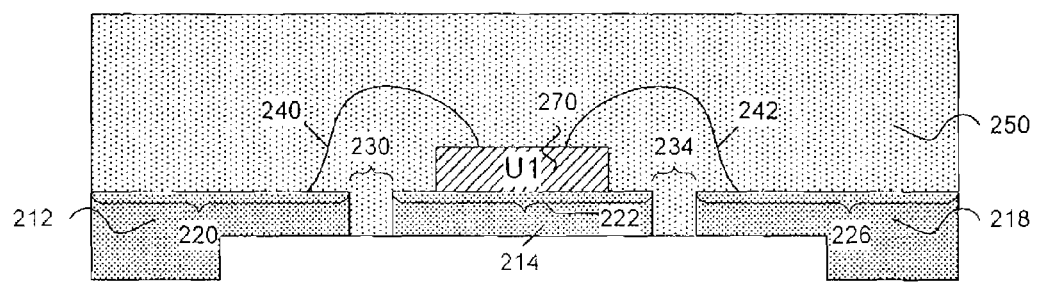
FIG. 2A illustrates a cross sectional view of a package in fabrication according to an alternative embodiment of the invention, corresponding to an intermediate step of packaging.

FIG. 2A shows a cross sectional view of a package in the process of fabrication according to an alternative embodiment of the invention. A fabrication process as described above and shown in achieving the package in FIG. 1E may be used in a similar manner to achieve the package shown in FIG. 2A, and is therefore omitted for brevity. However, in contrast to the package shown in FIG. 1E, FIG. 2A provides an alternative embodiment for another exemplary package, which differs from FIG. 1E in that contact lead frame portion 112 is also an extended contact lead frame portion 212, similar to extended contact lead frame portion 218.

Figure 2B:
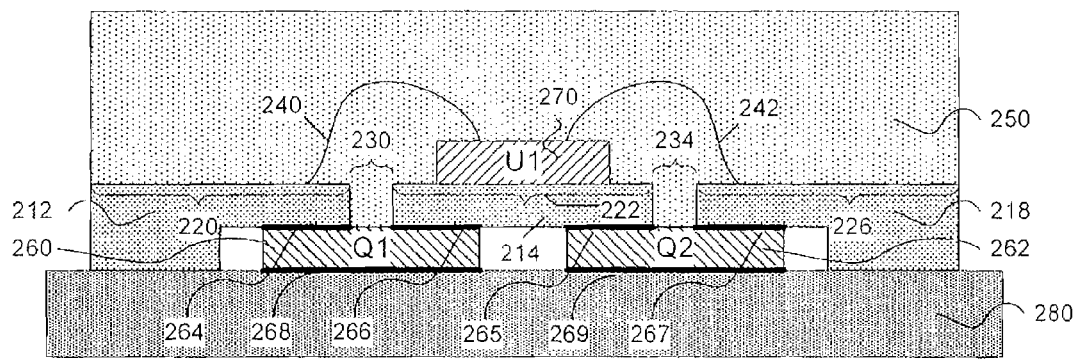
FIG. 2B illustrates a cross sectional view of a package in fabrication according to the embodiment of the invention in FIG. 2A, corresponding to a final step of packaging.

FIG. 2B shows a cross sectional view of a package in the process of fabrication continuing from FIG. 2A. Since extended contact lead frame portion 212 provides additional space for contact under the package compared to contact lead frame portion 112 of FIG. 1E, two semiconductor devices 260 and 262 can be attached to the bottom of the package instead of a single semiconductor device 160. Thus, semiconductor device 260, labeled Q1 (e.g. a first power transistor), is attached to the bottom of paddle portion 214 via electrical contact interface 266, and semiconductor device 262, labeled Q2 (e.g. a second power transistor), is attached to the bottom of paddle portion 214 via electrical contact interface 265. Semiconductor device 260 is also in direct electrical contact with extended contact lead frame portion 212, and semiconductor device 262 is also in direct electrical contact with extended contact lead frame portion 218. After attaching semiconductor devices 260 and 262, the fabrication of the package is essentially complete and the package may then be attached on top of PCB 280 for integration using electrical contact interface 268 on the bottom surface of semiconductor device 160 and electrical contact interface 269 on the bottom surface of semiconductor device 162.

As with FIG. 1F, the terminal assignments for interfaces 264 through 269 may be flexibly arranged depending on various requirements. In one embodiment, interfaces 264 and 267 may each be connected to a gate terminal, interfaces 268 and 265 may each be connected to a source terminal, and interfaces 266 and 269 may each be connected to a drain terminal. Semiconductor devices 260 and 262 are both electrically connected to semiconductor device 270 (U1) (e.g., a control IC), and may therefore be controlled by voltages provided by semiconductor device 270. Moreover, since semiconductor devices 260 and 262 both share the same double-sided direct contact configuration as semiconductor device 160 in FIG. 1F, similar packaging advantages such as improved current handling, thermal dissipation, reduced form factor and footprint, and improved stability and reliability are achieved.

Figure 3A:
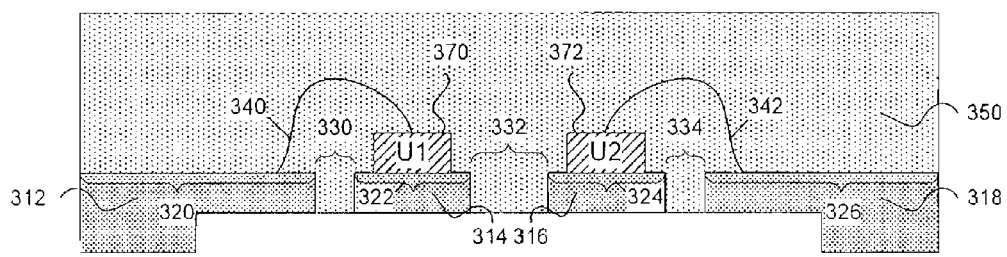
FIG. 3A illustrates a cross sectional view of a package in fabrication according to yet another embodiment of the invention, corresponding to an intermediate step of packaging.

FIG. 3A shows a cross sectional view of a package in the process of fabrication of still another embodiment of the present invention. A fabrication process as described above to achieve the package in FIG. 1E may be used in a similar manner to fabricate the package in FIG. 3A. FIG. 3A provides an alternative embodiment for another exemplary package, which differs from FIG. 2A in that paddle portion 214 and attached semiconductor device 270 are replaced with two paddle portions 314 and 316 with two attached semiconductor devices 370 (U1) (e.g., a first control IC) and 372 (U2) (e.g., a second control IC), respectively.

Figure 3B:
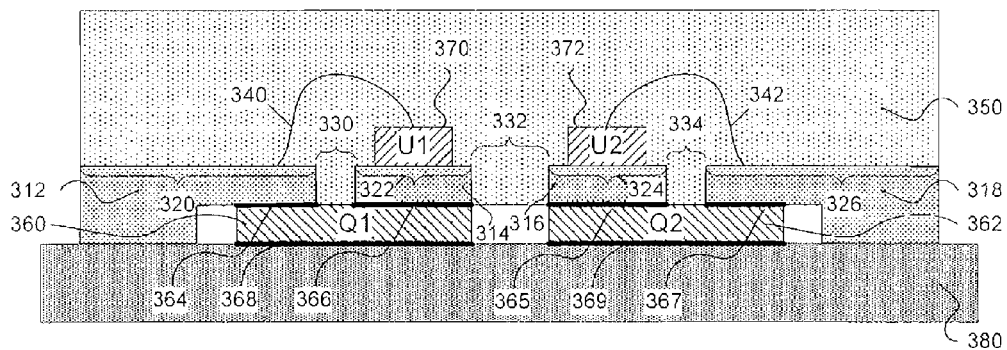
FIG. 3B illustrates a cross sectional view of a package in fabrication according to the embodiment of the invention in FIG. 3A, corresponding to a final step of packaging.

The package in FIG. 3B may function in a similar manner as FIG. 2B except that two separate semiconductor devices 370 and 372 control semiconductor devices 360 and 362 (which might be two power transistors), rather than the single unified semiconductor device 270 from FIG. 2B.

Thus, a direct contact leadless package and related structure and method resulting in a semiconductor package especially suitable for high current devices have been described to advantageously achieve, among other things, low manufacturing cost, high current density handling, improved thermal dissipation, and reduced form factor and footprint. The mechanical structure of the invention's direct contact leadless package provides space for bottom-mounted semiconductor devices such as power transistors for direct connection to the remaining lead frame portions. This direct and efficient connection allows the power transistors to have direct contact from both sides: to a PCB on the bottom and to the lead frame portions on the top, allowing better conduction and heat dissipation enabled by large contact surface areas and short electrical routes. Moreover, the invention's direct contact leadless package is cost effective since existing manufacturing process may be used. Moreover, the simplicity of the package structure allows for a reduced form factor and footprint, and contributes to stability and reliability, and avoids creation of high mechanical stress areas present in conventional packages.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor package comprising:
    a first contact lead frame portion, a paddle portion, and an extended contact lead frame portion held together by a mold compound;
    a first semiconductor device attached to a top side of said paddle portion and enclosed by said mold compound;
    a second semiconductor device attached to a bottom side of said paddle portion and in electrical contact with said first semiconductor device;
    said extended contact lead frame portion being in direct electrical contact with said second semiconductor device without using a bond wire; and
    a thickness of said paddle portion less than a thickness of said first contact lead frame portion.

2. The semiconductor package of claim 1, further comprising a printed circuit board (PCB) attached to a bottom side of said second semiconductor device.

3. The semiconductor package of claim 1, wherein the first semiconductor device is a control integrated circuit (IC).

4. The semiconductor package of claim 1, wherein the second semiconductor device is a power transistor.

5. The semiconductor package of claim 4, wherein a gate terminal of said power transistor is in direct electrical contact with said extended contact lead frame portion.

6. A semiconductor package comprising:
    a first contact lead frame portion, a paddle portion, and an extended contact lead frame portion;
    a control IC attached to a top side of said paddle portion;
    a power transistor attached to a bottom side of said paddle portion and in electrical contact with said control IC;
    said extended contact lead frame portion being in direct electrical contact with said power transistor; and a thickness of said paddle portion less than a thickness of said first contact lead frame portion.

7. The semiconductor package of claim 6, further comprising a printed circuit board (PCB) attached to a bottom side of said power transistor.

8. The semiconductor package of claim 6, wherein a gate terminal of said power transistor is in direct electrical contact with said extended contact lead frame portion.

9. The semiconductor package of claim 6, wherein said first contact lead frame portion, said paddle portion, and said extended contact lead frame portion are held together by a mold compound.

10. The semiconductor package of claim 9, wherein said control IC is attached to said top side of said paddle portion and is enclosed by said mold compound.

11. The semiconductor package of claim 6, wherein said extended contact lead frame portion is in direct electrical contact with said power transistor without using a bond wire.

12. The semiconductor package of claim 6, wherein said extended contact lead frame portion is in direct electrical contact with said power transistor without using a conductive clip.

* * * * *